United States Patent [19]

Celling

[11] 3,811,183

[45] May 21, 1974

[54] METHOD OF MANUFACTURING A SEMICONDUCTOR DEVICE AND SEMICONDUCTOR DEVICE MANUFACTURED BY THE METHOD

[75] Inventor: Wolter Geppienus Celling, Emmasingel, Eindhoven, Netherlands

[73] Assignee: U.S. Philips Corporation, New York, N.Y.

[22] Filed: Jan. 27, 1972

[21] Appl. No.: 221,164

[30] Foreign Application Priority Data

Feb. 5, 1971 Netherlands ........................ 7101601

[52] U.S. Cl. ........................ 29/588, 29/589, 156/330

[51] Int. Cl. ................................................ B01j 17/00

[58] Field of Search ....... 29/588, 589; 156/329, 330

[56] References Cited

UNITED STATES PATENTS

| | | | |
|---|---|---|---|
| 3,341,649 | 9/1967 | James | 29/588 |
| 3,440,717 | 4/1969 | Hill | 29/588 |
| 3,285,802 | 11/1966 | Smith et al. | 156/329 |
| 3,297,186 | 1/1967 | Wells | 156/329 |
| 3,317,287 | 5/1967 | Caracciolo | 29/576 S |
| 3,469,953 | 9/1969 | St. Clair | 29/576 S |

*Primary Examiner*—W. C. Tupman
*Attorney, Agent, or Firm*—Norman N. Spain; Frank R. Trifari

[57] ABSTRACT

The invention relates to a method of manufacturing a semiconductor device in which a conductive pattern of a semiconductor body which is, for example, reinforced, is connected to a conductive pattern of a substrate by so-called "face-down-bonding."

According to the invention, this connection can be mechanically reinforced by introducing a liquid in the aperture between the semiconductor body and the substrate, after having connected the latter together. The liquid is then hardened. The hardening of the liquid and the passivation of the semiconductor body are then obtained simultaneously by the use of certain silanes.

3 Claims, 1 Drawing Figure

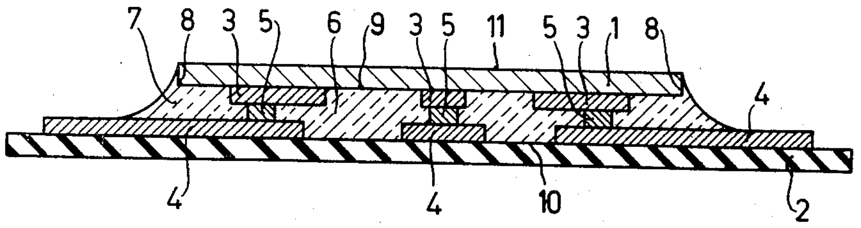
7
8
3
5
6
9
3
5
11
5
3
1
8
4
4
4
10
2

METHOD OF MANUFACTURING A SEMICONDUCTOR DEVICE AND SEMICONDUCTOR DEVICE MANUFACTURED BY THE METHOD

The invention relates to a method of manufacturing a semiconductor device in which a surface of a semiconductor body and a surface of a substrate are connected together mechanically by an insulating adhering layer and in which an electrically conductive connection is produced between parts of a conductive pattern on said surface of the semiconductor body and parts of a conductive pattern on the said surface of the substrate.

The invention furthermore relates to a semiconductor device, for example a transistor, a diode or an integrated circuit, manufactured by means of the method.

It is known to connect a semiconductor body having parts of a conductive pattern, reinforced, for example, electrolytically, to parts of a conductive pattern on a substrate by soldering. Such an electrically conductive connection is not always sufficiently rigid a fact which becomes apparent in particular when the substrate is flexible, for example, when it consists of a synthetic foil. Upon manipulating a flexible substrate, it is often subject to changes in shape as a result of which inadmissibly high stresses can occur in the electric connection and the connections break.

The possibility also exist that in the case of a change in shape of a flexible substrate the conductive patterns on the semiconductor body and the substrate contact each other in undesirable places.

It is known from Dutch Patent Application 6915992 to provide a semiconductor body having a conductive pattern with an insulating layer of adhesive, with which the semiconductor body is adhered to a foil of a synthetic resin. Corresponding parts of conductive patterns on the semiconductor body and the foil of synthetic resin are then connected together after which the layer of adhesives is hardened.

The method described in the above patent application has the drawback that adhesive also lodges on the parts of the conductive pattern still to be connected, which adhesive has to be removed from said parts by pressing the semiconductor body and the substrate against each other. Such a removal may be incomplete. Residues of adhesives often are the reason that the resultant connections have inferior electric and mechanical properties in particular when corresponding parts of the conductive patterns are connected thermally during which decomposition of the residues may occur.

It is also highly desirable for the insulating adhering layer to have a passivating effect on the semiconductor body.

One of the objects of the invention is to avoid the described drawback at least for the greater part and to provide a passivating insulating adhering layer.

The invention is based on the recognition of the fact that methods of adhering can be found by means of appropriate adhesives in which the parts of the conductive patterns to be connected (which parts must always be as clean as possible) are not covered with adhesive or adhesive material.

The method mentioned in the preamble is therefore characterized in that the electrically conductive connection between the semiconductor body and the substrate is first produced, after which a liquid is drawn into the free space between the semiconductor body and the substrate and is converted into the insulating adhesive layer by hardening.

In the method according to the invention the parts of the conductive patterns to be connected are thus kept clean.

The drawing-in of the liquid through an aperture between the semiconductor body and the substrate occurs by capillary action due to the small dimension of the aperture. The dimension of the aperture between the semiconductor body and the substrate is preferably chosen to be between 1 $\mu$ and 100 $\mu$.

An additional advantage of the capillary drawing-in of the liquid as compared with the squeezing-out of the excessive adhesive according to the prior art is that in the method according to the invention the quantity of excessive material which is not used for adhering purposes can be minimized since the liquid is preferably contacted locally with the aperture between the semiconductor body and the substrate and can nevertheless substantially fill the whole free space between the two.

In choosing the liquid it is of importance that during hardening no important changes in shape occur, for example, by evaporation of its solvent, as a result of which the filling of the free space between the semiconductor body and the substrate and hence the mechanical bonding would be incomplete and electric short-circuit might occur between the conductive patterns.

A liquid which contains an organic epoxy compound and a silane of which at least one hydrogen atom is replaced by an amino-alkyl group and at least one hydrogen atom is replaced by an —OR— group, wherein O = oxygen and R = a hydrocarbon radical, is preferably drawn into the free space between the semiconductor body and the substrate. The favourable effect of such a liquid is probably due on the one hand to the adhesion of such a silane to oxidic surfaces by reaction of the —OR— group with hydroxyl groups present on said surfaces, and on the other hand to the adhesive effect of organic epoxy compounds on substrates of, for example, high-molecular organic material, and to the reaction of the amino compound with the epoxy compound during the hardening. At any rate, an adhering layer with the said amino compound shows a significantly passivating effect which is of particular importance for that side of the semiconductor body where the conductive pattern is present and which faces the substrate.

An amino-alkyl silane in which at least three hydrogen atoms bound to silicon are replaced by —OR— groups before it is combined with the organic epoxy compound is preferably reacted, in the presence of water, with a silane in which at least one hydrogen atom is replaced by a hydrocarbon radical and at least three hydrogen atoms bound to silicon are replaced by —OR— groups.

In this reaction polymeric siloxanes are formed. The polymeric siloxane compounds together with the epoxy compound give a particularly readily insulating adhering layer in the free space between the semiconductor body and the substrate, while the passivation of the semiconductor body can also be said to be excellent.

For the ratio between the number of molecules of amino-alkyl silane and the number of molecules of hydrocarbon silane a value of approximately 1 : 3 is preferably chosen. With this value optimum properties of the adhering layer are obtained. With such a composition the liquid consists for approximately 50 percent by weight of the polymerized siloxane.

Usual compounds such as the diglycidyl ether of 4, 4′ diphenylolpropane 2,2′ may be used as an epoxy compound. Preferably a flexible foil is chosen as the substrate.

The invention also relates to a semiconductor device manufactured by means of the method according to the invention.

In order that the invention may be readily carried into effect, one embodiment thereof will now be described in greater detail, by way of example, with reference to the accompanying drawing, the sole FIGURE of which is a diagrammatic sectional view of a semiconductor device in a state of manufacture by means of the method according to the invention.

Such a state is achieved, for example, by means of usual planar methods in which regions of opposite conductivity types adjoining the semiconductor surface 9 are formed in a semiconductor body 1 by using photoetching and diffusion processes. The surface 9 of the semiconductor body 1 and the surface 10 of the substrate 2 are also provided with conductive patterns 3 and 4 by means of photo etching methods. The surface 9 of the semiconductor body 1 and the surface 10 of the substrate 2 are mechanically connected together by an insulating adhering layer 7, and an electrically conductive connection is produced, for example by soldering or an ultrasonic treatment, between projecting parts 5 of the conductive pattern 3 on the said surface 9 of the semiconductor body 1 and parts of the conductive pattern 4 on the said surface 10 of the substrate 2.

According to the invention, the electrically conductive connection between the semiconductor body 1 and the substrate 2 is first produced after which a liquid is drawn into by capillary action in the free space between the semiconductor body and the substrate, said liquid being converted into the insulating adhering layer 7 by hardening. The distance between the surfaces 9 and 10 is, for example, 20 $\mu$.

Reinforced parts may also occur or occur exclusively on the substrate and may project beyond the side faces 8 of the semiconductor body.

The substrate consists, for example, of a polyimide foil, for example, of the material known commercially as Kapton, but it may also consist of a ceramic material, for example aluminum oxide.

In the method described, the upper surface 11 of the semiconductor body 1 remains free and may be provided with a current conductor or be connected to a suitable heat dissipator.

If desirable, the conductive pattern 4 may be provided with current conductors as a result of which it becomes suitable for assembly in an envelope or on a printed circuit board.

If desirable, the method may be carried out so that several semiconductor bodies are connected to a long foil ribbon, after which the foil ribbon is divided into parts having one or more semiconductor bodies.

The liquid employed is obtained, for example, by reacting a silane, in which at least one hydrogen atom is replaced by an amino-alkyl group and at least three hydrogen atoms bound to silicon are replaced by —OR— groups, wherein O = oxygen and R = a hydrocarbon radical, for example, n-aminopropyl triethoxymonosilane, in the presence of water, with a silane, in which at least one hydrogen atom is replaced by a hydrocarbon radical and at least three hydrogen atoms bound to silicon are replaced by —OR— groups, for example, phenyltriethoxymonosilane. The molar ratio between the aminopropyl silane and the phenyl silane is approximately 1 : 3.

The reaction between two silanes is carried out, for example, as follows.

22.1 g (0.1 gmol) of $\gamma$-amino-propyltriethoxy silane and 72.3 (0.3 gmol) of phenyltriethoxy silane are weighed in a glass vessel. 10 ml of a solution of water in absolute ethanol (totally 16.2 gmol of water in 100 ml) is then added, said 10 ml containing 0.09 gmol of $H_2O$. The vessel is closed by means of a ground piece which has an open capillary and is heated for 4 hours in a furnace at 100° to 110°C. The vessel is swirled once in fifteen minutes. Cooling is then carried out, another 0.09 gmol of $H_2O$ in alcoholic solution is added and heating is carried out again at 100°–110°C for 4 hours. This treatment is repeated another two times with the difference that the last time heating is carried out at 125°–130°C for 8 hours. The added ethanol as well as the enthanol liberated during the reaction evaporates via the capillary in which substantially no air can penetrate into the capillary. The last traces of ethanol are driven out of the vessel after the reaction by heating the vessel at 130°–150°C while dry nitrogen is passed over the residue in the container via a separate inlet. The residue in the vessel resembles a thin oil and weighs 67 to 67.5 g which corresponds substantially to the weight to be expected theoretically on the basis of the added quantity of water and the occurred reaction. 339 g of the residue comprises 1 g.at. of hydrogen bound to nitrogen and one nitrogen atom has two directly bound hydrogen atoms.

3.39 g of the residue is then carefully mixed with 2.2 g of the dry diglycidyl ether of 4,4′ diphenylolpropane 2,2′ the equivalent weight of which is approximately 185. The resulting liquid is heated at 50° - 60° C for 15 to 30 minutes in a closed polythene bottle so as to obtain a certain pre-polymerizate. During this pre-heating the viscosity increases in accordance with the temperature and time of heating. A very small drop of the liquid is then placed adjacent the semiconductor body on the substrate by means of a micro dropping pipette after the conductive connection between the body and the substrate has been effected. The semiconductor body and the substrate are pre-heated at 70° to 80°C during providing the drop. As soon as the drop is contacted with the edge of the semiconductor body it creeps between said body and the substrate.

The liquid gels in 10 to 15 minutes and at 125° C to a no longer sticky mass so that the assembly of semiconductor body and, for example, synthetic foil substrate may then be rinsed and further hardened at 125° C for 16 – 24 hours.

It has been found in passivating processes that the current amplification and the leakage current of transistors vary only inconsiderably when the semiconductor device is maintained at 67° C for 500 hours and 95 percent relative humidity.

The invention is not restricted to the example described. It is possible, for example, to use, instead of the liquid with the aminoalkyl silane and the epoxy compound, a liquid with an acryl silane and a styrene compound with an accelerator on a peroxide basis.

In addition to the epoxy compound, a hardener, for example of the anhydride type, may also be used.

Good results are obtained in general when the ratio between the number of molecules of γ-aminopropyltriethoxy silane and the number of molecules of phenyltriethoxy silane is chosen to be between 2 : 1 and 1 : 5.

What is claimed is:

1. In the method of manufacturing a semiconductor device in which a surface of a semiconductor body and a surface of a substrate are connected together mechanically by an insulating adhering layer and in which an electrically conductive connection is produced between parts of a conductive pattern on said surface of the semiconductor body and parts of a conductive pattern on said surface of the substrate, the improvement which comprises first forming the electrically conductive connection between the semiconductor and the substrate then drawing a hardenable liquid by capillary action between the semiconductor body and the substrate and hardening said liquid to form an insulating layer adhering to the semiconductor body and the substrate, said hardenable liquid comprising an organic epoxy compound and a silane formed by reacting, in the presence of water, an amino-alkyl silane in which at least three hydrogen atoms bound to silicon are replaced by —OR— groups with a silane in which at least one hydrogen atom is replaced by a hydrocarbon radical and at least three hydrogen atoms bound to silicon are replaced by —OR—groups, O in said OR groups being oxygen and R in said OR groups being hydrocarbon.

2. The method of claim 1 wherein the molecular ratio of the amino-alkyl silane to the hydrocarbon silane is about 1:3.

3. The method of claim 1 wherein the substrate is a flexible foil.

* * * * *